United States Patent
Lu et al.

(10) Patent No.: US 12,512,824 B2
(45) Date of Patent: Dec. 30, 2025

(54) DELAY CHAIN CIRCUIT AND ELECTRONIC DEVICE

(71) Applicant: SHENZHEN PANGO MICROSYSTEMS CO., LTD., Shenzhen (CN)

(72) Inventors: Haozan Lu, Shenzhen (CN); Peng Wu, Shenzhen (CN); Xuelei Xuan, Shenzhen (CN)

(73) Assignee: SHENZHEN PANGO MICROSYSTEMS CO., LTD., Shenzhen (CN)

( * ) Notice: Subject to any disclaimer, the term of this patent is extended or adjusted under 35 U.S.C. 154(b) by 52 days.

(21) Appl. No.: 18/586,575

(22) Filed: Feb. 26, 2024

(65) Prior Publication Data

US 2024/0356538 A1  Oct. 24, 2024

(30) Foreign Application Priority Data

Apr. 19, 2023 (CN) .......................... 202310421725.7

(51) Int. Cl.
  *H03K 5/13*     (2014.01)
  *H03K 5/1252*   (2006.01)
  *H03K 5/133*    (2014.01)

(52) U.S. Cl.
  CPC ........... *H03K 5/133* (2013.01); *H03K 5/1252* (2013.01)

(58) Field of Classification Search
  CPC ........ H03K 5/133; H03K 5/1252; H03K 5/14; H03K 5/134; H03K 19/20; H03K 2005/00195; H03K 5/125; H03K 17/16; H03K 17/161; H03K 17/162; H03K 19/00346; H03K 19/00361
  See application file for complete search history.

(56) References Cited

U.S. PATENT DOCUMENTS 8,513,993 B2 * 8/2013 Takahashi .............. G11C 7/222
                                                327/158

FOREIGN PATENT DOCUMENTS

| JP | 2003091331 A | 3/2003 |
| JP | 2008067352 A | 3/2008 |
| JP | 2011009922 A | 1/2011 |

OTHER PUBLICATIONS

JPO, Office Action for JP Application No. 2024-010619, Mar. 13, 2025 (18 pages).
KIPO, Office Action for KR Application No. 10-2024-0015454, May 23, 2025 (14 pages).
JPO, Office Action for JP Application No. 2024-010619, Aug. 29, 2025 (13 pages).

* cited by examiner

*Primary Examiner* — Jung Kim (57) ABSTRACT

A delay chain circuit includes a delay branch, an inverting processing branch and a glitch elimination branch. The delay branch receives an input signal to obtain a first delayed signal and a second delayed signal. The inverting processing branch receives the first delayed signal to obtain a third delayed signal, and receives the second delayed signal to obtain a fourth delayed signal. The glitch elimination branch combines the third delayed signal and the fourth delayed signal to obtain a combined signal, and inverts the combined signal to obtain an output signal. An electronic device includes the delay chain circuit.

20 Claims, 5 Drawing Sheets

DELAY CHAIN CIRCUIT AND ELECTRONIC DEVICE

CROSS-REFERENCING OF RELEVANT APPLICATION

This application claims priority to Chinese patent application No. CN202310421725.7, filed Apr. 19, 2023. The entire contents of the aforementioned application are incorporated herein by reference.

TECHNICAL FIELD

The present disclosure relates to the technology field of circuits, and specifically to a delay chain circuit and an electronic device.

BACKGROUND

A configurable delay chain is a circuit structure that can achieve different delay effects by controlling an input delay code value. The configurable delay chain is widely configured in various physical layer (PHY) designs and is an important circuit component in many interface modules, especially an integral part in PHY of high-speed interface systems such as DDR and Serdes. How to design an accurate and efficient delay chain is usually the performance bottleneck of high-speed interface systems.

In existing delay chain designs, no glitch-free switching function is enabled; and basically, a same circuit structure is configured to achieve several fixed delay units. In such design, no matter how the delay code value is changed, there is a possibility that a transmission signal may conflict with transformation of the delay code value, which would cause a glitch in the transmission signal and thus causes a risk to the transmission system. Therefore, in the mainstream design, it is required that signal transmission is not performed when the delay code value is changed, and the signal transmission may be continued only after the delay code value is stable. This design has great limitations in practical applications. In many systems, due to the inability to interrupting the transmission of data stream, it is required that the delay code value remains unchanged, which causes many restrictions on a high-speed interface system.

SUMMARY

The present disclosure provides a delay chain circuit and an electronic device

Embodiments of the present disclosure are realized using the technical solutions as follows.

The delay chain circuit includes a delay branch, an inverting processing branch and a glitch elimination branch. The delay branch is configured to perform delay processing on an input signal to obtain a first delayed signal and a second delayed signal, where there is a delay amount between the first delayed signal and the second delayed signal. The inverting processing branch is configured to perform inverting and delay processing on the first delayed signal to obtain a third delayed signal, and perform inverting and delay processing on the second delayed signal to obtain a fourth delayed signal. The glitch elimination branch is configured to combine the third delayed signal and the fourth delayed signal to obtain a combined signal, and perform inverting processing on the combined signal to obtain an output signal; where a delay amount of the output signal is between a delay amount of the third delayed signal and a delay amount of the fourth delayed signal.

The embodiments of the present disclosure also provide an electronic device including the delay chain circuit described above.

The above aspects or other aspects of the present disclosure will be more concise in the description of following embodiments.

BRIEF DESCRIPTION OF THE DRAWINGS

In order to more clearly illustrate technical solutions in the embodiments of the present disclosure, the accompanying drawings to be used in the description of the embodiments are briefly introduced below. Apparently, the accompanying drawings in the following description are merely some of the embodiments of the present disclosure, and those skilled in the art can obtain other accompanying drawings according to these drawings without paying any creative effort.

DETAILED DESCRIPTION

The embodiments of the present disclosure are described below in detail, and examples of the embodiments are shown in the accompanying drawings. Throughout the disclosure, the same or similar reference labels denote the same or similar components or components having the same or similar functions. The embodiments described below by reference to the accompanying drawings are exemplary and are intended to be used only for the purpose of interpreting the present disclosure and are not to be construed as a limitation on the present disclosure.

In order to enable those skilled in the art to better understand the solutions of the present disclosure, the technical solutions in the embodiments of the present disclosure will be clearly and completely described below in conjunction with the accompanying drawings in the embodiments of the present disclosure. Obviously, the described embodiments are only a part of the embodiments of the present disclosure, and not all of the embodiments. Based on the embodiments of the present disclosure, all other embodiments obtained by those skilled in the art without paying any creative effort shall fall within the scope of protection of the present disclosure.

The embodiments of the present disclosure provide a delay chain circuit and an electronic device, which are capable of realizing a function of switching the delay chain without generating a glitch, on the basis of certain restrictions on each change of the delay code value; as such, a delay provided by the delay chain can be dynamically adjusted without interrupting the transmission of data stream, thereby greatly improving the performance of the high-speed interface system.

The delay chain circuit includes a delay branch, an inverting processing branch and a glitch elimination branch. The delay branch is configured to perform delay processing on an input signal to obtain a first delayed signal and a second delayed signal, where there is a delay amount between the first delayed signal and the second delayed signal. The inverting processing branch is configured to perform inverting and delay processing on the first delayed signal to obtain a third delayed signal, and perform inverting and delay processing on the second delayed signal to obtain a fourth delayed signal. The glitch elimination branch is configured to combine the third delayed signal and the fourth delayed signal to obtain a combined signal, and perform inverting processing on the combined signal to obtain an output signal; where a delay amount of the output signal is between a delay amount of the third delayed signal and a delay amount of the fourth delayed signal.

In some implementations, the delay branch includes a first coarse delay chain and a second coarse delay chain connected in parallel. The first coarse delay chain is configured to delay the input signal for multiple coarse delay durations to obtain the first delayed signal. The second coarse delay chain is configured to delay the input signal for multiple coarse delay durations to obtain the second delayed signal.

In some implementations, the first coarse delay chain includes multiple first coarse delay groups sequentially connected in series, each of the multiple first coarse delay groups is configured to receive one first coarse delay coded signal, and each of the multiple first coarse delay groups includes at least two first coarse delay units. For each of the multiple first coarse delay groups, when the first coarse delay coded signal corresponding to the first coarse delay group is valid, each of the at least two first coarse delay units in the first coarse delay group is valid; and when the first coarse delay unit is valid, the first coarse delay unit is configured to delay the input signal for one coarse delay duration. The first coarse delay chain is configured to determine a delay amount for the input signal, based on the number of valid first coarse delay coded signals corresponding to the multiple first coarse delay groups and the number of the first delay units included in the multiple first coarse delay groups, and perform, based on the determined delay amount, the delay processing on the input signal to obtain the first delayed signal.

In some implementations, the second coarse delay chain includes one forced delay unit and multiple second coarse delay groups. The forced delay unit is connected in series with the multiple second coarse delay groups, and the multiple second coarse delay groups are sequentially connected in series. Each of the multiple second coarse delay groups is configured to receive one second coarse delay coded signal, and includes at least two second coarse delay units. For each of the multiple second coarse delay groups, when the second coarse delay coded signal corresponding to the second coarse delay group is valid, each of the at least two second coarse delay units in the second coarse delay group is valid; and when the second coarse delay unit is valid, the second coarse delay unit is configured to delay the input signal for one coarse delay duration. The forced delay unit is configured to delay the input signal for one coarse delay duration. The second coarse delay chain is configured to determine a delay amount for the input signal, based on the number of valid second coarse delay coded signals corresponding to the multiple the second coarse delay groups, the number of the second coarse delay units included in the multiple second coarse delay groups, and the forced delay unit; and delay the input signal based on the determined delay amount, to obtain the second delayed signal.

In some implementations, the inverting processing branch includes two fine delay chains. One of the two fine delay chains is configured to invert the first delayed signal, and delay the inverted first delayed signal for multiple fine delay durations to obtain the third delayed signal. The other one of the two fine delay chains is configured to invert the second delayed signal, and delay the inverted first delayed signal for multiple fine delay durations to obtain the fourth delayed signal. Delay amounts provided by the two fine delay chains are the same, and a maximum total sum of the multiple fine delay durations provided by each fine delay chain is equal to one coarse delay duration.

In some implementations, each of the fine delay chains includes a first switch and a second switch. The first switch is configured to connect the glitch elimination branch with a high level when the first delayed signal or the second delayed signal is low. The second switch is configured to ground the glitch elimination branch when the first delayed signal or the second delayed signal is high.

In some implementations, the first switch and the second switch are both electronic switches. Control terminals of the first switch and the second switch are both configured to receive the first delayed signal or the second delayed signal. An input terminal of the first switch is configured to be connected with the high level, an output terminal of the first switch is connected with an input terminal of the second switch, an output terminal of the second switch is grounded, and the glitch elimination branch is connected between the first switch and the second switch.

In some implementations, the fine delay chain includes multiple fine delay units connected in parallel, each of the multiple fine delay units includes one charging current source and one discharging current source connected in series. Each of the multiple fine delay units is configured to receive one fine delay coded signal. When the fine delay coded signal is valid, the charging current source and the discharging current source of the corresponding fine delay unit are turned off, and the corresponding fine delay unit is configured to increase the delay amount of signal by one fine delay duration. When the fine delay coded signal is invalid, the charging current source and the discharging current source of the corresponding fine delay unit are turned on, and the corresponding fine delay unit is configured to decrease the delay amount of the inverted first delayed signal or the inverted second delayed signal by one fine delay duration. Each of the fine delay chains is configured to determine, based on the number of the valid fine delay coded signals corresponding to the multiple the fine delay units and the number of the charging current sources and the discharging current sources that are turned off, a delay amount for the first delayed signal or the second delayed signal, and delay, based on the determined delay amount, the inverted first delayed signal or the inverted second delayed signal, to obtain the third delayed signal or the fourth delayed signal.

In some implementations, the glitch elimination branch includes an output inverter and a capacitor. One terminal of the capacitor is connected with an input terminal of the output inverter, and is connected between negative terminals of the charging current sources and positive terminals of the discharging current sources, and the other terminal of the capacitor is grounded. The capacitor is configured to combine the third delayed signal and the fourth delayed signal to obtain the combined signal. The output inverter is configured to perform inverting processing on the combined signal to obtain the output signal.

The embodiments of the present disclosure also provide an electronic device including the delay chain circuit described above.

Different from the related art, in the delay chain circuit and the electronic device provided in the embodiments of the present disclosure, a delay circuit performs different delay processing on an input signal, and a first delayed signal and a second delayed signal, that have different delay amounts from each other, are thus obtained. An inversion processing branch performs inverting and delay processing on the first delayed signal, to thereby obtain a third delayed signal is obtained by inverting through, and the inversion processing branch performs inverting and delay processing on the second delayed signal, to thereby obtain a fourth delayed signal. A glitch elimination branch combines the third delayed signal and the fourth delayed signal to obtain a combined signal. The combined signal is inverted to obtain an output signal, where a delay amount of the output signal is between a delay amount of the third delayed signal and a delay amount of the fourth delayed signal. When there is a need to adjust the delay chain, a delay amount of any one of the first delayed signal and the second delayed signal is adjusted, so that the glitch appears on only the first delayed signal or on only the second delayed signal. Then, when the glitch elimination branch combines the third delayed signal and the fourth delayed signal, the glitch is eliminated through such combination. The output signal is obtained by inverting the combined signal. In this way, the delay of the delay chain can be dynamically adjusted without interrupting the input signal, and the delay chain can be switched without generating a glitch.

Figure 1:
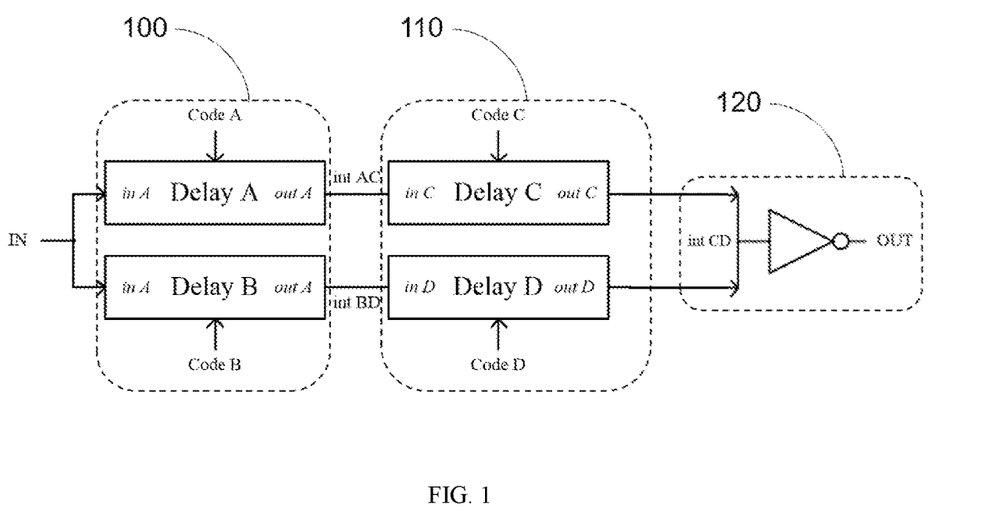
FIG. 1 is a schematic block diagram illustrating modules of a delay chain circuit provided by some embodiments of the present disclosure.

As illustrated in FIG. 1, FIG. 1 schematically illustrates a schematic diagram illustrating modules of a delay chain circuit provided by the present disclosure. The delay chain circuit includes a delay branch 100, an inverting processing branch 110, and a glitch elimination branch 120. The delay branch 100 performs delay processing on an input signal IN to obtain a first delayed signal "int AC" and a second delayed signal "int BD", and there is a delay amount between the first delayed signal "int AC" and the second delayed signal "int BD".

Specifically, the delay branch 100 includes a first coarse delay chain "Delay A" and a second coarse delay chain "Delay B" connected in parallel, and an input terminal "in A" of the first coarse delay chain "Delay A" and an input terminal "in B" of the second coarse delay chain "Delay B" simultaneously receive the input signal IN, in which the input signal IN may be a clock signal or other periodic signals. The first coarse delay chain "Delay A" is configured to delay the input signal IN for multiple coarse delay durations CD, and output the first delayed signal "int AC" from the output terminal "out A". The second coarse delay chain "Delay B" is configured to delay the input signal IN for multiple coarse delay durations CD, and obtain the second delayed signal "int BD" from the output terminal "out B".

The inverting processing branch 110 performs inverting and delay processing on the first delayed signal "int AC" to obtain a third delayed signal "output Delay C", and performs inverting and delay processing on the second delayed signal "int BD" to obtain a fourth delayed signal "output Delay D".

Specifically, the inverting processing branch 110 includes two fine delay chains: "Delay C" and "Delay D", the structures of "Delay C" and "Delay D" are the same. An input terminal "in C" of one fine delay chain "Delay C" is connected with an output terminal "out A" of the first coarse delay chain "Delay A", and the fine delay chain "Delay C" is configured to invert the first delayed signal "int AC", and delay the inverted signal for multiple fine delay durations FD to obtain the third delayed signal "output Delay C".

An input terminal "in D" of the other fine delay chain "Delay D" is connected with the output terminal "out B" of the second coarse delay chain "Delay B". The fine delay chain Delay D is configured to invert the second delayed signal "int BD", and delay the inverted signal for multiple fine delay durations FD to obtain the fourth delayed signal output "Delay D".

A maximum total delay amount which may be provided by the multiple fine delay durations FD in the fine delay chain "Delay C" and fine delay chain "Delay D" is equal to a delay amount provided by one coarse delay duration CD, that is, CD=m*FD (m is a positive integer).

The glitch elimination branch 120 is connected with both the two output terminals, "out C" and "out D", of the fine delay chains. The glitch elimination branch 120 combines the third delayed signal output "Delay C" and the fourth delayed signal output "Delay D" to obtain a combined signal "int CD", and inverts the combined signal "int CD" to obtain an output signal OUT. A delay amount of the output signal OUT is between a delay amount of the third delayed signal "output delay C" and a delay amount of the fourth delayed signal "output delay D".

The first coarse delay chain "Delay A" and the second coarse delay chain "Delay B" receive the input signal IN at the same time, the first delay chain "Delay A" and the second delay chain "Delay B" perform different delay processing on the input signal IN to obtain the first delayed signal "int AC" and the second delayed signal "int BD" that have different delay amounts from each other. The fine delay chain Delay C performs inverting and delay processing on the first delayed signal "int AC" to obtain the third delayed signal output "Delay C". The fine delay chain Delay D performs inverting and delay processing on the second delayed signal "int BD" to obtain the fourth delayed signal "output Delay D". The glitch elimination branch 120 combines the third delayed signal "output Delay C" and the fourth delayed signal "output Delay D" to obtain the combined signal "int CD", and performs inverting processing on the combined signal "int CD" to obtain the output signal OUT, in which the delay amount of the output signal OUT is between the delay amount of the third delayed signal "output Delay C" and the delay amount of the fourth delayed signal "output Delay D". When the delay chain needs to be adjusted, a delay amount of any one of the first delayed signal "int AC" and the second delayed signal "int BD" is adjusted, so that a glitch appears on only the first delayed signal "int AC" or on only the second delayed signal "int BD". Then, when the glitch elimination branch 120 combines the third delayed signal "output Delay C" and the fourth delayed signal "output Delay D", the glitch is eliminated through such combination. The combined signal "int CD" is inverted to obtain the output signal OUT. In this way, the delay of the delay chain can be dynamically adjusted without interrupting the input signal, and the delay chain can be switched without generating a glitch.

Figure 2:
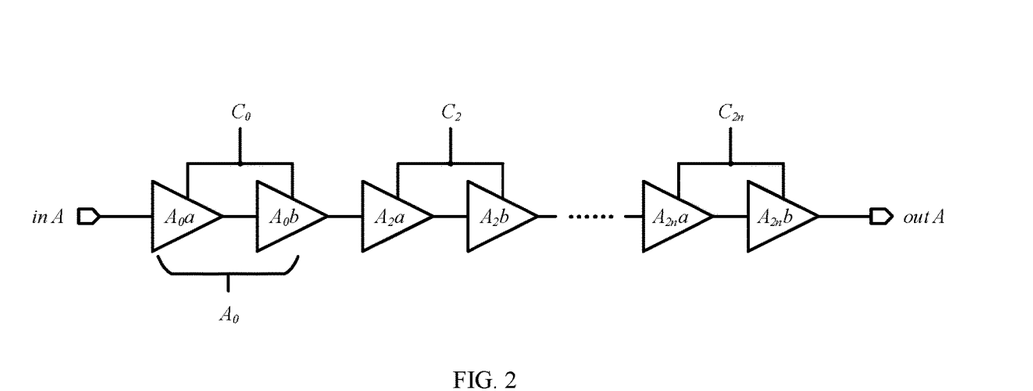
FIG. 2 is a schematic diagram illustrating a first coarse delay chain provided by some embodiments of the present disclosure.

As illustrated in FIG. 2, FIG. 2 is a schematic diagram illustrating the first coarse delay chain "Delay A". The first coarse delay chain "Delay A" includes multiple first coarse delay groups sequentially connected in series, each first coarse delay group is configured to receive one first coarse delay coded signal, and each first coarse delay group includes at least two first coarse delay units. For example, the first coarse delay group $A_0$ includes two first coarse delay units $A_0a$ and $A_0b$, and is configured to receive the first coarse delay coded signal $C_0$. For each first coarse delay group, if the first coarse delay coded signal corresponding to the first coarse delay group is valid, each of the first coarse delay units in the first coarse delay group is valid. When the first coarse delay unit is valid, the first coarse delay unit is configured to delay the input signal IN for one coarse delay duration CD; when the first coarse delay unit is invalid, the first coarse delay unit does not delay the input signal IN.

It is understood that the first coarse delay unit may use a delay circuit such as an RC delay circuit, a transistor delay circuit, or the like, as long as the input signal IN can be delayed for one coarse delay duration CD without changing the polarity of the input signal IN when the input signal IN passes therethrough, which is not specifically limited in the embodiments of the present disclosure.

The first coarse delay chain "Delay A" is configured to determine a delay amount for the input signal IN, based on the number of valid first coarse delay coded signals corresponding to the first coarse delay groups and the number of first delay units included in the first coarse delay groups, and perform, based on the determined delay amount, delay processing on the input signal IN to obtain the first delayed signal "int AC".

In some embodiments, the first coarse delay chain "Delay A" is controlled by a code A, in which the code A includes n+1 bits of first coarse delay code $C_0, C_2 \ldots C_{2n}$ (n is any positive integer). (n+1) first coarse delay groups are connected in series, each first coarse delay group includes two first coarse delay units, and each first coarse delay group receives one first coarse delay coded signal.

It is to be understood that, when the code A has carry in of 1, that is, the number of valid first coarse delay coded signals is increased by one, the delay amount of the first delayed signal is increased by two coarse delay durations CD. The entire first coarse delay chain "Delay A" may provide at most n+1 steps of delay level, each step provides two coarse delay durations CD, and the entire first coarse delay chain "Delay A" may provide at most 2n+2 coarse delay durations CD.

Figure 3:
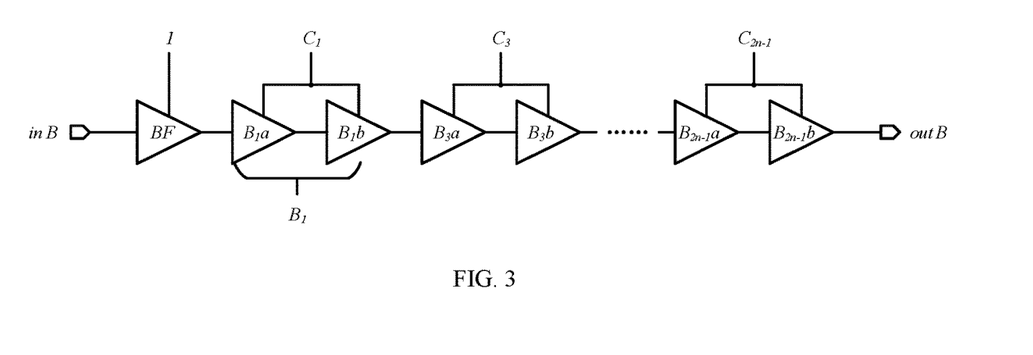
FIG. 3 is a schematic diagram illustrating a second coarse delay chain provided by some embodiments of the present disclosure.

As illustrated in FIG. 3, FIG. 3 is a schematic diagram illustrating the second coarse delay chain "Delay B". The second coarse delay chain "Delay B" includes one forced delay unit BF, and multiple second coarse delay groups sequentially connected in series, and the forced delay unit is connected in series with the second coarse delay groups. Each of the second coarse delay groups is configured to receive one second coarse delay coded signal, and each of the second coarse delay groups includes at least two second coarse delay units. For example, the second coarse delay group $B_1$ includes two second coarse delay units $B_1a$ and $B_1b$, and is configured to receive the second coarse delay coded signal $C_1$.

For each second coarse delay group, if the second coarse delay coded signal corresponding to the second coarse delay group is valid, each second coarse delay unit in the second coarse delay group is valid. When the second coarse delay unit is valid, the second coarse delay unit is configured to delay the input signal IN for one coarse delay duration CD; and when the second coarse delay unit is invalid, the second coarse delay unit does not delay the input signal IN. The forced delay unit is configured to delay the input signal IN for one coarse delay duration CD.

It is to be understood that the forced delay unit and the second coarse delay unit may use RC delay circuits, transistor delay circuits, etc., as long as the forced delay unit and the second coarse delay unit each may delay the input signal IN by one coarse delay duration CD without changing the polarity of the input signal IN when the input signal IN passes therethrough, which is not specifically limited in the embodiments of the present disclosure.

The second coarse delay chain "Delay B" is configured to determine a delay amount for the input signal IN, based on the number of valid second coarse delay coded signals corresponding to the multiple second coarse delay groups, the number of second coarse delay units included in the second coarse delay groups, and the forced delay unit, and delay the input signal IN based on the determined delay amount, to obtain the second delayed signal "int BD".

In some embodiments, the second coarse delay chain "Delay B" is controlled based on a code B, the code B includes n bits of second coarse delay codes $C_1, C_3 \ldots C_{2n-1}$ (n is any positive integer). The second coarse delay chain "Delay B" is provided with n second coarse delay groups, each second coarse delay group is configured to receive one second coarse delay coded signal, and each second coarse delay group includes two second coarse delay units. The entire second coarse delay chain "Delay B" may provide at most n steps of delay level (n is any positive integer), each step provides two coarse delay durations CD, and the second coarse delay chain "Delay B" may provide at most 2n+1 coarse delay durations.

In some embodiments, the interleaved combination of Code A and Code B may generate a continuous code of 2n+1 bits, "Code Coarse": $C_0, C_1, C_2 \ldots C_{2n-1}, C_{2n}$, this continuous code being a thermometer code.

Understandably, due to the existence of the forced delay unit, no matter how the continuous code "Code Coarse" changes, a difference between the delay amount of the first delayed signal "int AC" and the delay amount of the second delayed signal "int BD" is always one coarse delay duration CD. In addition, when the continuous code "Code Coarse" is changed bit by bit, that is, when the "Code Coarse" has carry in of 1 or has carry out of 1 (that is, borrows 1), only one of the first delayed signal "int AC" and the second delayed signal "int BD" generates a delay amount of two coarse delay durations CD, so that the glitch is only generated on the one of the first delayed signal "int AC" and the second delayed signal "int BD".

Figure 4:
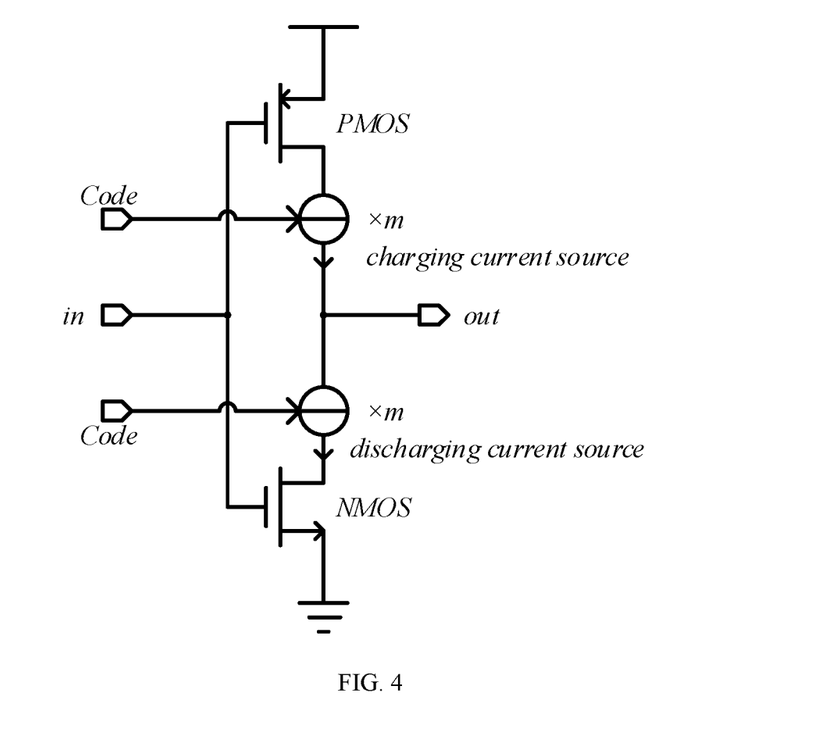
FIG. 4 is a schematic circuit diagram of a fine delay chain provided by some embodiments of the present disclosure.

As illustrated in FIG. 4, FIG. 4 is a schematic circuit diagram of the fine delay chain. The two fine delay chains, "Delay C" and "Delay D", have the same structure, so that the two fine delay chains, "Delay C" and "Delay D" provide the same delay amount. It is illustrated by taking the fine delay chain "Delay C" as an example.

The fine delay chain "Delay C" includes a first switch and a second switch, and the first switch and the second switch are electronic switches.

Control terminals of both the first switch and the second switch are configured to receive the first delayed signal "int AC". An input terminal of the first switch is configured to be connected to a high level, an output terminal of the first switch is connected with an input terminal of the second switch, and output terminal of the second switch is grounded. The glitch elimination branch 120 is connected between the output terminal of the first switch and the input terminal of the second switch.

The first switch is configured to connect the glitch elimination branch to the high level when the first delayed signal "int AC" is a low-level signal; and the second switch is configured to ground the glitch elimination branch 120 when the first delayed signal "int AC" is a high-level signal.

The first switch may be a field effect transistor, a relay, or a triode, as long as the first switch can enable the glitch elimination branch 120 to be connected with the high level when the input to the control terminal is the low-level signal. The first switch is not specifically limited in the embodiments of the present disclosure.

The second switch may be a field effect transistor, a relay, or a triode, as long as the second switch can enable the glitch elimination branch to be grounded when the input to the control terminal is the high-level signal. The second switch is not specifically limited in embodiments of the present disclosure.

In some embodiments, the first switch is a PMOS transistor, the gate of the PMOS transistor is configured to receive the first delayed signal "int AC", the source of the PMOS transistor is configured to connect the high level, and the drain of the PMOS transistor is connected with the glitch elimination branch. The second switch is an NMOS transistor, the gate of the NMOS transistor is configured to receive the first delayed signal "int AC", the drain of the NMOS transistor is connected with the glitch elimination branch 120, and the source of the NMOS transistor is grounded.

It is understood that, when the first delayed signal or the second delayed signal is a low-level signal, the first switch PMOS transistor is on, the second switch NMOS transistor is off, and the glitch elimination branch 120 is connected with the high level. When the first delayed signal or the second delayed signal is a high-level signal, the first switch PMOS transistor is off, the second switch NMOS transistor is on, and the glitch elimination branch 120 is grounded.

As illustrated in FIG. 4, the fine delay chain Delay C further includes multiple fine delay units connected in parallel. Each fine delay unit includes one charging current source and one discharging current source, the charging current source and the discharging current source being connected in series.

The charging current source and the discharging current source are both configured to adjust an amount of charge input to the glitch elimination branch 120, thereby adjusting a rate of voltage change and thus adjusting the delay duration. A positive terminal of each charging current source is connected with the drain of the first switch PMOS transistor, a negative terminal of each charging current source is connected with a positive terminal of the discharging current source, and a negative terminal of each discharging current source is connected with the input of the second switch NMOS transistor. The glitch elimination branch 120 is connected between the multiple charging current sources and the multiple discharging current sources.

It is understood that, when the first delayed signal "int AC" is the low-level signal, the first switch PMOS transistor is on, that is, a branch where the charging current source is located is in a connected state, and the multiple charging current sources may charge the glitch elimination branch 120; at this time, the second switch NMOS transistor is off, that is, a branch where the discharging current source is located is in a disconnected state, and the discharging current source cannot discharge to the glitch elimination branch 120. When the first delayed signal "int AC" is the high level signal, the first switch PMOS transistor is off, that is, the branch in which the charging current source is located is in the disconnected state, and the charging current source is unable to charge the glitch elimination branch 120; at this time, the second switch NMOS transistor is in the connected state, i.e., the branch in which the discharging current source is located is in the connected state, and the multiple discharging current sources may discharge to the glitch elimination branch 120.

Further, each fine delay unit is configured to receive one fine delay coded signal. When the fine delay coded signal is valid, the charging current source and the discharging current source of the corresponding fine delay unit are turned off, this fine delay unit causes the delay amount of the signal to be increased by one fine delay duration FD. When the fine delay coded signal is invalid, the charging current source and the discharging current source of the corresponding fine delay unit are turned on, this fine delay unit causes the delay amount of the signal to be decreased by one fine delay duration FD.

The fine delay chain "Delay C" is configured to determine the delay amount, based on the number of valid fine delay coded signals corresponding to the multiple fine delay units, and the number of charging current sources and discharging current sources that are turned on. The fine delay chain Delay C then performs, based on the determined delay amount, delay processing on the first delayed signal "int AC" after subjecting to the inverting processing, to obtain the third delayed signal "output Delay C".

In some embodiments, each fine delay chain includes m charging current sources and m discharging current sources such that CD=m*FD. The fine delay chain "Delay C" is controlled based on the Code C, and the fine delay chain "Delay D" is controlled based on the Code D. Code C and Code D have the same coded content and each includes m bits of fine delay coded signals $F_0, F_1 \ldots F_{m-2}, F_{m-1}$. Code C and Code D are also in a form of continuous thermometer code "Code Fine".

Specifically, when the fine delay coded signal is valid, the corresponding current sources are taken as being turned off, currents of the charging current source and the discharging current source are decreased, and the delay amount of the signal is increased by 1 FD through the delay unit. When the fine delay coded signal is invalid, the current sources are taken as being turned on, the currents of the charging current source and the discharging current source are increased, and the delay amount of the signal is reduced by 1 FD through the delay unit. The number of valid fine delay coded signals is changed by changing the "Code Fine", thereby changing the number of charging current sources and discharging current sources that are turned on, and thus realizing the delay control.

It is understood that the number of the valid fine delay coded signals for the fine delay chain "Delay C" is always consistent with the number of the valid fine delay coded signals for the fine delay chain "Delay D" When the "Code Fine" is changed, the fine delay coded signals for the fine delay chain "Delay C" and the fine delay coded signals for the fine delay chain "Delay D" are changed synchronously, so that the delay amounts provided by the fine delay chain "Delay C" and the fine delay chain "Delay D" are always the same.

Figure 5:
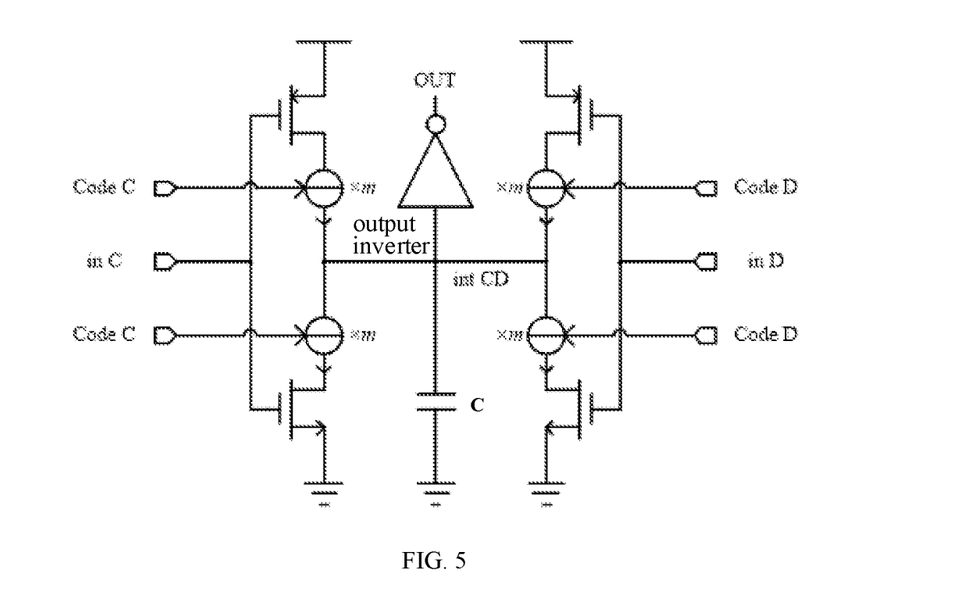
FIG. 5 is a schematic circuit diagram of the fine delay chain and a glitch elimination branch provided by some embodiments of the present disclosure.

As illustrated in FIG. 5, the glitch elimination branch 120 includes an output inverter and a capacitor C. One terminal of the capacitor C is connected with an input terminal of the output inverter, and it is connected between the negative terminals of the multiple charging current sources and the positive terminals of the multiple discharging current sources, and the other terminal of the capacitor C is grounded. The capacitor C is configured to combine the third delayed signal "output delay C" and the fourth delayed signal "output delay D" to obtain a combined signal "int CD". The output inverter is configured to perform inverting processing on the combined signal "int CD" to obtain the output signal OUT.

With regard to the third delayed signal "output Delay C" and the fourth delayed signal "output Delay D", when the "Code Fine" is changed, the number of operating charging current sources and the number of operating discharging current sources in the fine delay chain "Delay C" and the fine delay chain "Delay D" are changed, so that rates of charging and discharging the capacitor C by the fine delay chain "Delay C" and the fine delay chain "Delay D" are changed. In this way, the fine delay chain "Delay C" performs inverting and delay processing on the first delayed signal "int AC" to obtain the third delayed signal "output Delay C", and the fine delay chain "Delay D" may perform inverting and delay processing on the second delayed signal "int BD" to obtain the fourth delayed signal "output Delay D". As such, the third delayed signal "output Delay C" and the fourth delayed signal "output Delay D" do not generate a glitch. The analysis process is as follows (due to the same structure of the fine delay chain "Delay "C and the fine delay chain" Delay D", it is illustrated by taking the fine delay chain "Delay C" and the third delayed signal "output Delay C" as examples).

Figure 6:
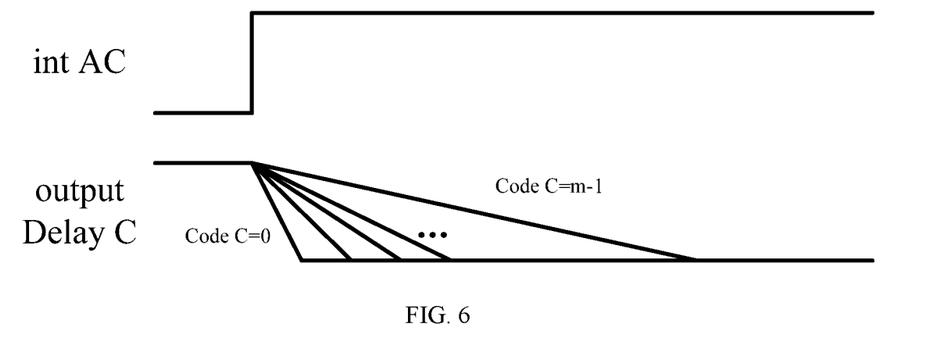
FIG. 6 illustrates waveforms of a first delayed signal and a third delayed signal provided by some embodiments of the present disclosure.

As illustrated in FIG. 6, FIG. 6 illustrates waveforms of the flipped first delayed signal "int AC" and the third delayed signal "output Delay C".

When the first delayed signal "int AC" is flipped from a low level to a high level, the first switch PMOS transistor is off, the branches where the charging current sources are located are disconnected, so that the charging current sources are disabled and the charging current sources cannot charge the capacitor C; at this time, the second switch NMOS transistor is on, so that the branches where the discharging current sources are located are connected, and the discharging current sources discharge the capacitor C, so that the third delayed signal "output Delay C" gradually decreases.

Exemplarily, when Code C=0, the number of valid fine delay coded signals is zero, all the discharge current sources are enabled, and all the discharge current sources are turned on, so that the capacitor C may be rapidly discharged, and the voltage of the third delayed signal "output Delay C" is rapidly decreased. As Code C increases, the number of the valid fine delay coded signals increases, and the number of discharging current sources that are turned on decreases, so that the discharging of the capacitor C slows down, the voltage of the third delayed signal "output Delay C" slowly decreases, thereby realizing the inverting and delay of the first delayed signal "int AC".

Figure 7:
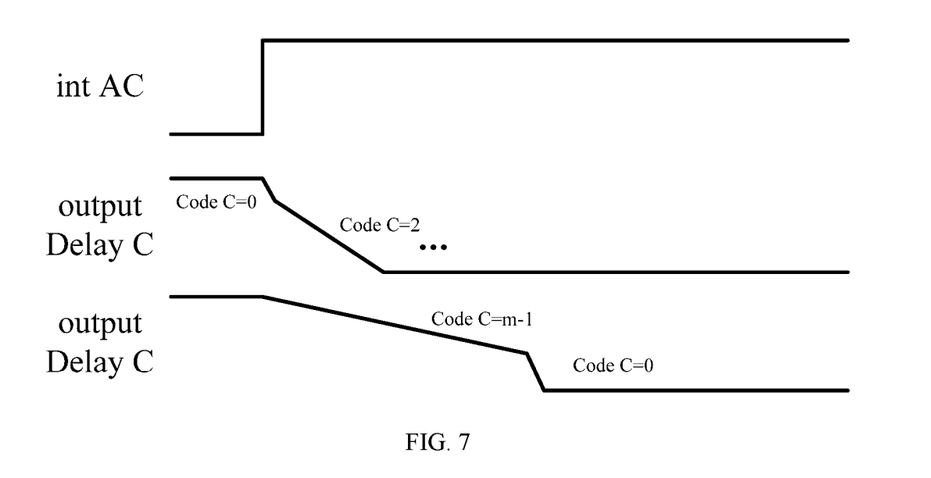
FIG. 7 illustrates waveforms of the first delayed signal and the third delayed signal provided by some other embodiments of the present disclosure.

If Code C is changed before the third delayed signal "output Delay C" reaches a steady state, the number of the valid fine delay coded signals is increased or decreased. In this case, the waveforms of the first delayed signal "int AC" and the third delayed signal "output Delay C" are as illustrated in FIG. 7.

Exemplarily, when Code C=0 is changed to Code C=2, that is, when Code C is increased, the number of the valid fine delay coded signals is increased, the corresponding discharge current sources are turned off, so that the discharging rate of the capacitor C decreases, and the third delayed signal "output Delay C" decreases at a slower rate, such that a time at which "output Delay C" finally reaches the steady state is delayed. When Code C=m−1 is changed to Code C=0, that is, when Code C is decreased, the number of the valid fine delay coded signals is decreased, the corresponding discharge current sources are turned on, so that the discharging rate of the capacitor C increases, the third delayed signal "output Delay C" decreases rapidly to reach the steady state, and the time at which the third delayed signal "output Delay C" reaches the steady state is advanced.

It is understood that the above process describes the impact of changes of Code C on the discharging rate of the capacitor C when the first delayed signal "int AC" is flipped from the low level to the high level, thereby achieving delay control of the third delayed signal "output Delay C". In a same way, it can be deduced that, when the first delayed signal "int AC" is flipped from the high level to the low level, the impact of changes of Code C on the charging rate of the capacitor C and on the steady-state establishment time of the third delayed signal "output Delay C". It can be seen that, no matter how Code C is changed, only the charging rate and discharging rate of the capacitor C are changed, which affects the time at which the third delayed signal "output Delay C" reaches the steady state, that is, the delay amount of the third delayed signal "output Delay C" is affected, and there are no new transformation or glitch generated on the third delayed signal "output Delay C".

Since the fine delay chain "Delay C" and fine delay chain "Delay D" have the same structure, it can be concluded by the same reason that, no matter how Code D is changed, only the charging rate and discharging rate of the capacitor C is changed, thus affecting the time at which the fourth delayed signal "output Delay D" reaches a steady state, that is, the delay amount of the fourth delayed signal "output Delay D" is affected, and there is no new transformation or glitch generated on the fourth delayed signal "output Delay D". Based on the above, when the Code Fine is changed, the fine delay chain "Delay C" and the fine delay chain "Delay D" themselves generate no glitch, that is, no glitch is generated on the third delayed signal "output Delay C" and the fourth delayed signal "output Delay D".

It can be seen that the structures of fine delay chain "Delay C" and the fine delay chain "Delay D" do not generate a glitch when Code Fine is switched bit by bit between zero and a full value; and generation of the first delayed signal "int AC" and the second delayed signal "int BD" are not affected when Code Fine is switched bit by bit between zero and the full value, that is, delay values generated by the first coarse delay chain "Delay A" and the second coarse delay chain "Delay B" are not affected.

When the Code Fine is continuously changed, the Code Fine would return to zero from the full value or jump to the full value from zero, which corresponds to carry in or carry out of one bit of the Code Coarse, and the delay amount of the first delayed signal "int AC" or the delay amount of the second delayed signal "int BD" is changed. In this case, an interpolator circuit formed by the fine delay chain "Delay C", the fine delay chain "Delay D" and the capacitor C, as well as separate configuration of the first coarse delay chain "Delay A" and the second coarse delay chain "Delay B", may be configured to filter out a glitch that may be generated due to changes of the Code Coarse. The specific process is as follows.

Exemplarily, assuming that Code Coarse is 2i−1 (i is any positive integer less than n) and Code Fine is m−1, and from the arrangement of Code Coarse, each of the first coarse delay chain "Delay A" and the second coarse delay chain "Delay B" provide i steps of delay level, and each of the fine delay chain "Delay C" and the fine delay chain "Delay D" respectively provide m−1 steps of delay level. In this way, an amount of delay time provided by a branch AC (including the first coarse delay chain "Delay A" and the fine delay chain "Delay C", similarly hereinafter) is 2i×CD+m×FD, and an amount of delay time provided by a branch BD (including the second coarse delay "chain Delay B" and the fine delay chain "Delay D", similarly hereinafter) is (2i+1)×CD+m×FD, and the delay amount of the output signal OUT is between 2i×CD+m×FD and (2i+1)×CD+m×FD.

When Code Fine, i.e., the thermometer code, has carry in of one from m−1, that is, it is increased to m, the Code Fine is actually cleared, and Code Coarse has carry in of 1, that is, Code Coarse is increased to 2i. At this time, the branch AC provides the amount of delay time: (2i+2)×CD, the branch BD provides the amount of delay time: (2i+1)×CD. The delay amount of the entire circuit is between (2i+1)×CD and (2i+2)×CD, that is, the first delayed signal "int AC" is increased by 2 CDs, the second delayed signal "int BD" remains unchanged, and the fine delay time FD provided by the fine delay chain "Delay C" and the fine delay chain "Delay D" resets to zero.

Figure 8:
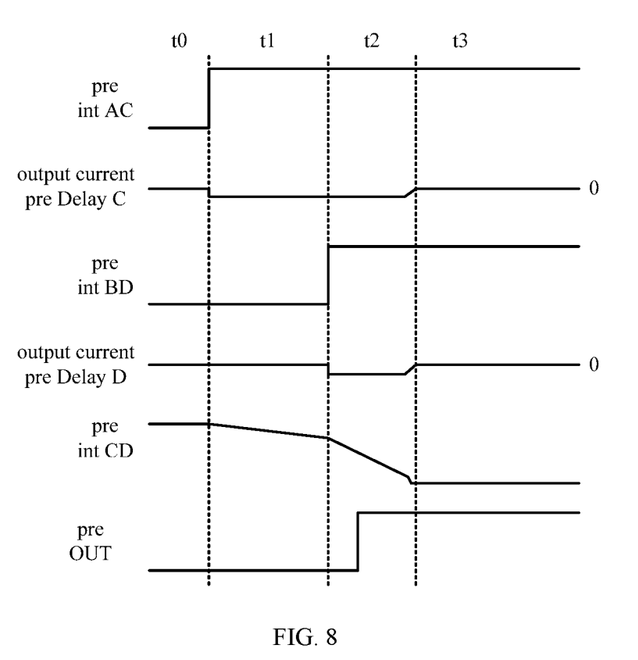
FIG. 8 illustrates waveforms of various signals before code value switching as provided by some embodiments of the present disclosure.

As illustrated in FIG. 8, FIG. 8 illustrates waveforms of various signals when there is no change in Code Coarse before the Code Fine thermometer code has carry in of one from m−1.

It is understood that a flip of the first delayed signal "int AC" and a flip of the second delayed signal "int BD" has a time difference of one CD therebetween, that is, a t1 interval in FIG. 8.

In t0 interval, there is no flip edge of the first delayed signal "int AC" or no flip edge of the second delayed signal "int BD". In t1 interval, the first delayed signal "int AC" is flipped from a low level to a high level, the branches of the charging current sources of the fine delay chain "Delay C" are disconnected, the branches of the discharging current sources are connected, the capacitor C is discharged to the ground, so that the output current "pre Delay C" of the fine delay chain "Delay C" is a negative small current $-I_{m-1}$, the voltage of the third delayed signal "output Delay C" begins to decrease. At this time, the second delayed signal "int BD" has not yet flipped, an output current "pre Delay D" of the fine delay chain "Delay D" does not change, the fourth delayed signal "output Delay D" does not change, a voltage of the combined signal "int CD" obtained by combining the third delayed signal "output Delay C" and the fourth delayed signal "output Delay D" starts to get smaller.

In t2 interval, the second delayed signal "int BD" is flipped from a low level to a high level, so that the branches of the charging current sources of the fine delay chain "Delay D" are disconnected, the branches of the discharging current sources are connected, the capacitor C is discharged to the ground, the output current "pre Delay" D of the fine delay chain "Delay D" is also a negative small current $-I_{m-1}$, the fourth delayed signal "output Delay D" begins to decrease. At this time, the voltage of the combined signal "int CD" begins to decrease rapidly, and when the combined signal "int CD" is below a threshold voltage of the output inverter, the output signal OUT is flipped in this interval, and the combined signal "int CD" is inverted by the output inverter to obtain the output signal OUT.

In t3 interval, the capacitor C no longer discharges after its charge is released, the combined signal "int CD" reaches a steady state, the fine delay chain "Delay C" and the fine delay chain "Delay D" no longer discharge, and a delay flip-flop process ends.

Figure 9:
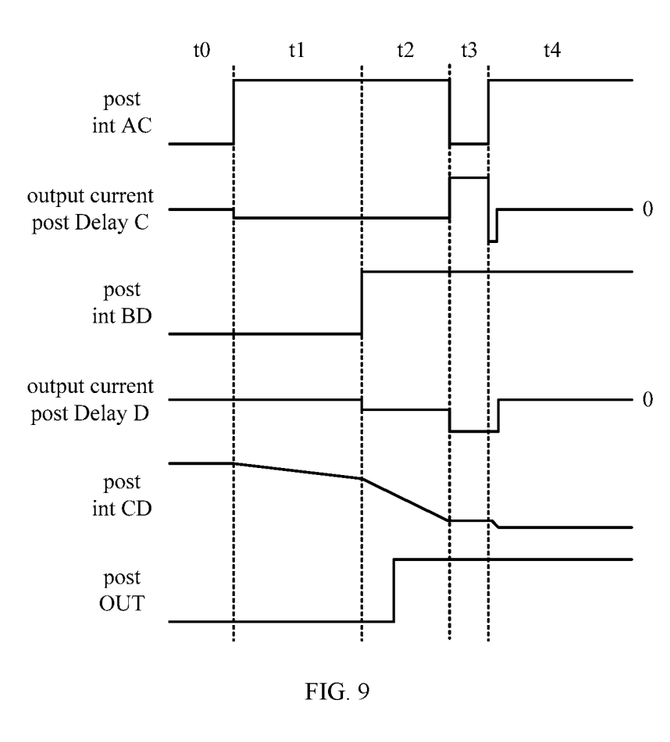
FIG. 9 illustrates waveforms of various signals after the code value switching as provided by some embodiments of the present disclosure.

In some embodiments, as illustrated in FIG. 9, FIG. 9 illustrates waveforms of the various signals when the Code Fine thermometer code has carry in of 1 from m−1 and Code Coarse has carry in of 1, according to some other embodiments.

It is understood that, before Code Coarse has carry in of 1, the first delayed signal "int AC" is ahead of the second delayed signal "int BD" by the time difference of one CD, and after Code Coarse has carry in of 1, the first delayed signal "int AC" is behind of the second delayed signal "int BD" by the time difference of one CD. When the Code Coarse has the carry in of 1 exactly within two CDs after the first delayed signal "int AC" is flipped, a glitch is generated on the first delayed signal "int AC", as illustrated in FIG. 9. This glitch is not expected to be reflected in the output signal OUT, and the interpolator circuit, formed by "Delay C", "Delay D" and capacitor C, can filter out the glitch, and the specific process is as follows.

In the t0 interval, there is no flip edge of the first delayed signal "int AC" or no flip edge of the second delayed signal "int BD". In the t1 interval, the first delayed signal "int AC" is flipped, the output current "post Delay C" of the fine delay chain "Delay C" is a negative small current $-I_{m-1}$; at this time, the second delayed signal "int BD" has not yet been flipped, and the output current "post Delay D" of "Delay D" does not change significantly. That is, the voltage of the third delayed signal "output Delay C" begins to decrease, the fourth delayed signal "output Delay D" does not change, at this time, the voltage of the combined signal "int CD" begins to get smaller.

In the t2 interval, the second delayed signal "int BD" is flipped, and the output current "post Delay D" of the fine delay chain "Delay D" is also a small negative current $-I_{m-1}$, that is, the fourth delayed signal "output Delay D" also begins to decrease; at this time, the voltage of the combined signal "int CD" begins to change rapidly, and when it falls below the threshold voltage of the output inverter, the output signal OUT is flipped in this interval.

In the t3 interval, when the code value is flipped, the Code Coarse has carry in of 1, the first delayed signal "int AC" generates a glitch and is flipped; at this time, the first delayed signal "int AC" and the second delayed signal "int BD" have opposite polarities, and control codes Fine Code of the fine delay chain "Delay C" and the fine delay chain "Delay D" are reset to zero, and all the charging current sources and the discharging current sources are enabled. As such, in the fine delay chain "Delay C", the branches where the charging current sources are located are connected, the branches where the discharging current sources are located are disconnected, and the charging current sources charge the capacitor C, so that the output current "post Delay C" of the fine delay chain "Delay C" is a positive high current $I_0$, and the third delayed signal "output Delay C" is rapidly increased. In the fine delay chain "Delay D", the branches where the charging current sources are located are disconnected, the discharge current sources discharge the capacitor C, so that the output current "post Delay D" of the fine delay chain "Delay D" is a negative high current $-I_0$, the fourth delayed signal "output Delay D" is rapidly decreased. The third delayed signal "output Delay C" and the fourth delayed signal "output Delay D" are combined to cancel each other out, so that the voltage of the combined signal "int CD" does not change, and the state transition of the output signal OUT is not affected.

In the t4 interval, the first delayed signal "int AC" is flipped again and the flipped first delayed signal "int AC" has the same polarity as the second delayed signal "int BD". At this time, the output current "post delay C" of the fine delay chain "Delay C" and the output current "post delay D" of the fine delay chain "Delay D" are both negative high current $-I_0$, and the charge on the capacitor C is further released, and this process does not affect the state transition of the output signal OUT, and the delay flip-flop process ends.

Figure 10:
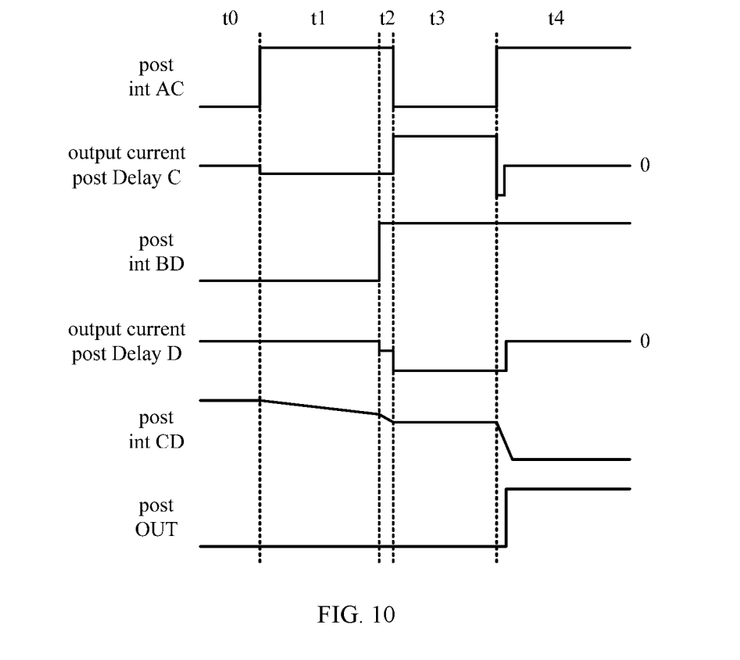
FIG. 10 illustrates waveforms of various signals after the code value switching as provided by yet some other embodiments of the present disclosure.

FIG. 10 illustrates waveforms of various signals for yet other embodiments. In some embodiments, when the Code Fine thermometer code has carry in of 1 from m−1 and Code Coarse has carry in of 1, there is a situation that the combined signal "int CD" does not reach the threshold voltage of the output inverter in the t2 interval, and the situation from t0 to t2 is the same as the situation from t0 to t2 in FIG. 9 except that the output signal OUT is not flipped in the t2 interval and maintains the state before the flip, which will not be repeated herein.

In the t3 interval, the output current "post Delay C" of the fine delay chain "Delay C" is a positive high current $I_0$, and the third delayed signal "output Delay C" is raised; the output current "post Delay D" of the fine delay chain "Delay D" is a negative high current $-I_0$, and the fourth delayed signal output Delay D is lowered. The third delayed signal "output Delay C" and the fourth delayed signal "output Delay D" cancel each other out, the voltage of the combined signal "int CD" has no change, and the output signal OUT is not flipped.

In the t4 interval, the first delayed signal "int AC" is flipped again to have the same polarity as the second delayed signal "int BD", at this time, the output current "post Delay C" of the fine delay chain "Delay C" and the output current "post Delay D" of the fine delay chain "Delay D" are both negative high current $-I_0$, the capacitor C is rapidly discharged until the charge is discharged, and the third delayed signal "output Delay C" and the fourth delayed signal "output Delay D" both decrease. The combined signal "int CD" rapidly decreases to reach the threshold of the output inverter, and the output signal OUT is flipped during this process and the delay flip process ends.

Figure 11:
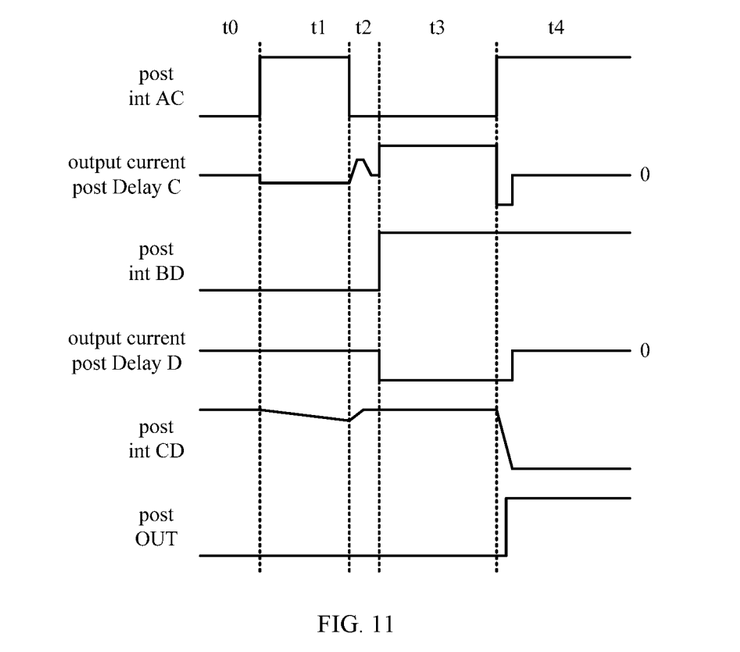
FIG. 11 illustrates waveforms of various signals after the code value switching as provided by still some other embodiments of the present disclosure.

FIG. 11 illustrates waveforms of various signals for yet some other embodiments. There is another situation where the carry in of 1 from m−1 for the Code Fine thermometer code and the carry in of 1 for the Code Coarse occur after the first delayed signal "int AC" is flipped and before the second delayed signal "int BD" is flipped. In the t1 interval, the first delayed signal "int AC" is flipped to a high level, and the output current "post Delay C" of the fine delay chain "Delay C" is a negative small current $-I_{m-1}$, the voltage of the third delayed signal "output Delay C" decreases, and the voltage of the combined signal "int CD" begins to slowly decrease.

At the beginning of the t2 interval, Code Coarse has carry in of 1 and Code Fine is cleared to zero, the first delayed signal "int AC" is flipped to a low level; at this time, the output current "post Delay C" of the fine delay chain "Delay C" outputs a positive high current $I_0$, the charging current sources charge the capacitor C until it is full, the voltage of the third delayed signal "output Delay C" rises rapidly, and the voltage of the combined signal "int CD" rises rapidly to a high level. After the capacitor C is full, the output current "post delay C" of the fine delay chain "Delay C" is reset to zero.

In the t3 interval, the second delayed signal "int BD" is flipped, and since Code Fine has been cleared, the output current "post Delay D" of the fine delay chain "Delay D" is a negative high current $I_0$. At this time, the output current "post Delay C" of the fine delay chain "Delay C" and the output current "post Delay D" of the fine delay chain "Delay D" are both $I_0$ but in opposite directions, which cancel each other out, so that the voltage of the combined signal "int CD" is unchanged.

In the t4 interval, the first delayed signal "int AC" is flipped again, at this time, the output current "post Delay C" of the fine delay chain "Delay C" and the output current "post Delay D" of the fine delay chain "Delay D" are both the negative high currents $I_0$, the capacitor C is rapidly discharged, and the combined signal "int CD" is rapidly decreased to reach the threshold voltage of the output inverter, and during this process, the output signal OUT is flipped, the delay flip process ends, and the output current "post Delay C" of the fine delay chain "Delay C" and the output current "post Delay D" of the fine delay chain "Delay D" are reset to zero.

In some embodiments, the change of code values that Code Coarse has carry in of 1 and Code Fine is cleared precedes the t0 interval, at this time, the first delayed signal "int AC" does not generate a glitch, so that the output signal OUT is not affected and no glitch is generated therefor. When the carry in of 1 for Code Coarse appears exactly outside of the two CDs after the first delayed signal "int AC" is flipped, that is, after the t4 interval, the output signal OUT has reached the steady state at this time, and the carry in of 1 for Code Coarse will not affect the output signal OUT.

In summary, when the change of code values that Code Coarse has carry in of 1 and Code Fine is cleared happens, the interpolator circuit formed by the fine delay chain "Delay C", the fine delay chain "Delay D", and the capacitor C, as well as the separate configuration of the first coarse delay chain "Delay A" and the second coarse delay chain "Delay B", can be configured to filter out the glitch that may be caused by the change of the code values, so that the output signal OUT is free from glitch.

In some other embodiments, assuming that the Code Coarse thermometer code is 2i−1 and the Code Fine thermometer code is 0, the amount of delay time provided by the branch AC is 2i×CD, the amount of delay time provided by the branch BD is (2i+1)×CD, and the delay amount of the entire circuit is between 2i×CD and (2i+1)×CD. When the Code Fine thermometer code has carry out of 1 from 0, that is, it is decreased to −1, which causes the Code Fine thermometer code actually to make all the bits thereof valid, Code Coarse has carry out of 1, that is, it is decreased to 2i−2. At this time, the amount of delay time provided by branch AC is 2i×CD+m×FD, the amount of delay time provided by branch BD is (2i−1)×CD+m×FD, and the delay amount of the entire circuit is between (2i−1)×CD+m×FD and 2i×CD+m×FD, that is, Delay A remains unchanged, Delay B is decreased by 2 CDs, and Delay C and Delay D increase to the maximum.

The same analysis of the process as described above is performed when Code Coarse has carry out of 1 and Code Fine has carry out of 1 from zero to make all the bits thereof valid, and it can be concluded that when the change of code values that Code Coarse has carry out of 1 and Code Fine makes all the bits thereof valid happens, the interpolator circuit formed by the fine delay chain "Delay C", the fine delay chain "Delay D", and the capacitor C, as well as the separate configuration of the first coarse delay chain "Delay A" and the second coarse delay chain "Delay B", can be configured to filter out a glitch that may be caused by the change of the code values, so that the output signal OUT is free from glitch.

The embodiments of the disclosure provide an electronic device which includes the delay chain circuit involved in the above embodiments.

In summary, the embodiments of the present disclosure provide the delay chain circuit and the electronic device. Through the above described delay chain circuit, when it is necessary to adjust the delay chain, the delay amount of any one of the first delayed signal "int AC" and the second delayed signal "int BD" is adjusted, so that the glitch appears on only the first delayed signal "int AC" or on only the second delayed signal "int BD". When the third delayed signal "int C" and the fourth delayed signal "int D" are combined by the capacitor C, the glitch is filtered out through such combination. The output inverter inverts the combined signal "int CD" to obtain the output signal OUT. In this way, the delay of the delay chain can be dynamically adjusted without interrupting the input signal IN, and the delay chain can be switched without generating a glitch.

The above are only the example embodiments of the present disclosure, and are not intended to limit the present disclosure in any form. Although the example embodiments of the present disclosure has been disclosed, the embodiments are not intended to limit the present disclosure, and any those in the art may use the technical contents disclosed above to make some changes or modifications to equivalent embodiments with equivalent changes without departing from the scope of the technical solutions of the present disclosure. Any simple modifications, equivalent changes and modifications made to the above embodiments based on the technical substance of the present disclosure without departing from the content of the technical solutions of the present disclosure shall fall within the scope of the technical solutions of the present disclosure.

What is claimed is:

1. A delay chain circuit, comprising:
   a delay branch, configured to perform delay processing on an input signal to obtain a first delayed signal and a second delayed signal, wherein there is a delay amount between the first delayed signal and the second delayed signal;
   an inverting processing branch, configured to perform inverting and delay processing on the first delayed signal to obtain a third delayed signal, and perform inverting and delay processing on the second delayed signal to obtain a fourth delayed signal; and
   a glitch elimination branch, configured to combine the third delayed signal and the fourth delayed signal to obtain a combined signal, and perform inverting processing on the combined signal to obtain an output signal;
   wherein a delay amount of the output signal is between a delay amount of the third delayed signal and a delay amount of the fourth delayed signal;
   wherein the delay branch comprises a first coarse delay chain and a second coarse delay chain connected in parallel, the first coarse delay chain is configured to delay the input signal for a first plurality of coarse delay durations to obtain the first delayed signal, and the second coarse delay chain is configured to delay the input signal for a second plurality of coarse delay durations to obtain the second delayed signal, wherein the first plurality of coarse delay durations is different from the second plurality of coarse delay durations;
   wherein the first coarse delay chain comprises a plurality of first coarse delay groups sequentially connected in series, and each of the plurality of first coarse delay groups is configured to receive one first coarse delay coded signal and comprises at least two first coarse delay units;
   for each of the plurality of first coarse delay groups, when the first coarse delay coded signal corresponding to the first coarse delay group is valid, each of the at least two first coarse delay units in the first coarse delay group is valid; and when the first coarse delay unit is valid, the first coarse delay unit is configured to delay the input signal for one coarse delay duration; and
   the first coarse delay chain is configured to determine a first delay amount for the input signal, based on the number of valid first coarse delay coded signals corresponding to the plurality of first coarse delay groups and the number of the first delay units included in each of the plurality of first coarse delay groups, and perform, based on the determined first delay amount, the delay processing on the input signal to obtain the first delayed signal.

2. The delay chain circuit of claim 1, wherein the second coarse delay chain comprises one forced delay unit and a plurality of second coarse delay groups, the forced delay unit is connected in series with the plurality of second coarse delay groups, and the plurality of second coarse delay groups are sequentially connected in series; each of the plurality of second coarse delay groups is configured to receive one second coarse delay coded signal and comprises at least two second coarse delay units;
   for each of the plurality of second coarse delay groups, when the second coarse delay coded signal corresponding to the second coarse delay group is valid, each of the at least two second coarse delay units in the second coarse delay group is valid; and when the second coarse delay unit is valid, the second coarse delay unit is configured to delay the input signal for one coarse delay duration;
   the forced delay unit is configured to delay the input signal for one coarse delay duration; and
   the second coarse delay chain is configured to determine a second delay amount for the input signal, based on the number of valid second coarse delay coded signals corresponding to the plurality of the second coarse delay groups, the number of the second coarse delay units included in each of the plurality of second coarse delay groups, and the forced delay unit, and delay the input signal based on the determined second delay amount, to obtain the second delayed signal.

3. The delay chain circuit of claim 1, wherein the inverting processing branch comprises a first fine delay chain and a second fine delay chain;
   the first fine delay chain is configured to invert the first delayed signal, and delay the inverted first delayed signal for a plurality of fine delay durations to obtain the third delayed signal; and
   the second fine delay chain is configured to invert the second delayed signal, and delay the inverted second delayed signal for the plurality of fine delay durations to obtain the fourth delayed signal;
   wherein delay amount provided by the first fine delay chain and delay amount provided by the second fine delay chain are the same, and a maximum total sum of the plurality of fine delay durations provided by each fine delay chain is equal to one coarse delay duration.

4. The delay chain circuit of claim 3, wherein each of the first fine delay chain and the second fine delay chain comprises:
- a first switch, configured to connect the glitch elimination branch with a high level when the first delayed signal or the second delayed signal is low; and
- a second switch, configured to ground the glitch elimination branch when the first delayed signal or the second delayed signal is high.

5. The delay chain circuit of claim 4, wherein the first switch and the second switch are both electronic switches; and
- control terminals of the first switch and the second switch are both configured to receive the first delayed signal or the second delayed signal, an input terminal of the first switch is configured to be connected with the high level, an output terminal of the first switch is connected with an input terminal of the second switch, an output terminal of the second switch is grounded, and the glitch elimination branch is connected between the first switch and the second switch.

6. The delay chain circuit of claim 4, wherein the first switch comprises a PMOS transistor, a gate of the PMOS transistor is configured to receive the first delayed signal, a source of the PMOS transistor is configured to connect the high level, and a drain of the PMOS transistor is connected with the glitch elimination branch; and
- the second switch comprises an NMOS transistor, a gate of the NMOS transistor is configured to receive the first delayed signal, a drain of the NMOS transistor is connected with the glitch elimination branch, and a source of the NMOS transistor is grounded.

7. The delay chain circuit of claim 3, wherein each of the first fine delay chain and the second fine delay chain comprises a plurality of fine delay units connected in parallel, each of the plurality of fine delay units comprises one charging current source and one discharging current source connected in series;
- each of the plurality of fine delay units is configured to receive one fine delay coded signal, and when the fine delay coded signal is valid, the charging current source and the discharging current source of the corresponding fine delay unit are turned off, and the corresponding fine delay unit is configured to increase the delay amount of the inverted first delayed signal or the inverted second delayed signal by one fine delay duration; when the fine delay coded signal is invalid, the charging current source and the discharging current source of the corresponding fine delay unit are turned on, and the corresponding fine delay unit is configured to decrease the delay amount of the inverted first delayed signal or the inverted second delayed signal by one fine delay duration; and
- each of the first fine delay chain and the second fine delay chain is configured to determine, based on the number of valid fine delay coded signals corresponding to the plurality of the fine delay units and the number of the charging current sources and the discharging current sources that are turned off, a third delay amount, and delay, based on the determined third delay amount, the inverted first delayed signal or the inverted second delayed signal to obtain the third delayed signal or the fourth delayed signal respectively.

8. The delay chain circuit of claim 7, wherein the glitch elimination branch comprises an output inverter and a capacitor, one terminal of the capacitor is connected with an input terminal of the output inverter, and is connected between negative terminals of the charging current sources and positive terminals of the discharging current sources, and the other terminal of the capacitor is grounded; and
- the capacitor is configured to combine the third delayed signal and the fourth delayed signal to obtain the combined signal; and the output inverter is configured to perform inverting processing on the combined signal to obtain the output signal.

9. An electronic device, comprising a delay circuit, wherein the delay chain circuit comprises:
- a delay branch, configured to delay an input signal for a first delay amount to obtain a first delayed signal, and delay the input signal for a second delay amount to obtain a second delayed signal, wherein the first delay amount is different from the second delay amount;
- an inverting processing branch, configured to invert the first delayed signal and delay the inverted first delayed signal for a third delay amount to obtain a third delayed signal, and invert the second delayed signal and delay the inverted second delayed signal for a fourth delay amount to obtain a fourth delayed signal, wherein the third delay amount is the same as the fourth delay amount; and
- a glitch elimination branch, configured to combine the third delayed signal and the fourth delayed signal to obtain a combined signal, and invert the combined signal to obtain an output signal, wherein a delay amount of the output signal is between a delay amount of the third delayed signal and a delay amount of the fourth delayed signal;
- wherein the delay branch comprises a first coarse delay chain and a second coarse delay chain connected in parallel, the first coarse delay chain is configured to delay the input signal for the first delay amount to obtain the first delayed signal, the second coarse delay chain is configured to delay the input signal for the second delay amount to obtain the second delayed signal, each of the first delay amount and the second delay amount comprises a plurality of coarse delay durations, the number of the coarse delay durations of the first delay amount is different from the number of the coarse delay durations of the second delay amount;
- wherein the first coarse delay chain comprises a plurality of first coarse delay groups sequentially connected in series, and each of the plurality of first coarse delay groups is configured to receive one first coarse delay coded signal and comprises at least two first coarse delay units;
- for each of the plurality of first coarse delay groups, when the first coarse delay coded signal corresponding to the first coarse delay group is valid, each of the at least two first coarse delay units in the first coarse delay group is valid; and when the first coarse delay unit is valid, the first coarse delay unit is configured to delay the input signal for one coarse delay duration; and
- the first coarse delay chain is configured to determine a delay amount for the input signal as the first delay amount, based on the number of valid first coarse delay coded signals corresponding to the plurality of first coarse delay groups and the number of the first delay units included in each of the first delay groups, and perform, based on the first delay amount, the delay processing on the input signal to obtain the first delayed signal.

10. The electronic device of claim 9, wherein the second coarse delay chain comprises one forced delay unit and a plurality of second coarse delay groups, the forced delay unit is connected in series with the plurality of second coarse delay groups, and the plurality of second coarse delay groups are sequentially connected in series; each of the plurality of second coarse delay groups is configured to receive one second coarse delay coded signal and comprises at least two second coarse delay units;

for each of the plurality of second coarse delay groups, when the second coarse delay coded signal corresponding to the second coarse delay group is valid, each of the at least two second coarse delay units in the second coarse delay group is valid; and when the second coarse delay unit is valid, the second coarse delay unit is configured to delay the input signal for one coarse delay duration;

the forced delay unit is configured to delay the input signal for one coarse delay duration; and     the second coarse delay chain is configured to determine a delay amount for the input signal as the second delay amount, based on the number of valid second coarse delay coded signals corresponding to the plurality of second coarse delay groups, the number of the second coarse delay units included in each of second coarse delay groups, and the forced delay unit, and delay the input signal based on the second delay amount to obtain the second delayed signal, wherein a difference between the first delay amount and the second delay amount is one coarse delay duration.

11. The electronic device of claim 9, wherein inverting processing branch comprises a first fine delay chain and a second fine delay chain;

the first fine delay chain is configured to invert the first delayed signal, and delay the inverted first delayed signal for the third delay amount to obtain the third delayed signal; and     the second fine delay chain is configured to invert the second delayed signal, and delay the inverted second delayed signal for the fourth delay amount to obtain the fourth delayed signal;

wherein each of the third delay amount and the fourth delay amount comprises a plurality of fine delay durations, and a maximum of each of the third delay amount and the fourth delay amount is equal to one coarse delay duration.

12. The electronic device of claim 11, wherein each of the first fine delay chain and the second fine delay chain comprises:

a first switch, configured to connect the glitch elimination branch with a high level when the first delayed signal or the second delayed signal is low; and     a second switch, configured to ground the glitch elimination branch when the first delayed signal or the second delayed signal is high.

13. The electronic device of claim 12, wherein the first switch and the second switch are both electronic switches; and     control terminals of the first switch and the second switch are both configured to receive the first delayed signal or the second delayed signal, an input terminal of the first switch is configured to be connected with the high level, an output terminal of the first switch is connected with an input terminal of the second switch, an output terminal of the second switch is grounded, and the glitch elimination branch is connected between the first switch and the second switch.

14. The electronic device of claim 11, wherein each of the first fine delay chain and the second fine delay chain comprises a plurality of fine delay units connected in parallel, each of the plurality of fine delay units comprises one charging current source and one discharging current source connected in series;

each of the plurality of fine delay units is configured to receive one fine delay coded signal, and when the fine delay coded signal is valid, the charging current source and the discharging current source of the corresponding fine delay unit are turned off, and the corresponding fine delay unit is configured to increase the delay amount of the inverted first delayed signal or the inverted second delayed signal by one fine delay duration; when the fine delay coded signal is invalid, the charging current source and the discharging current source of the corresponding fine delay unit are turned on, and the corresponding fine delay unit is configured to decrease the delay amount of the inverted first delayed signal or the inverted second delayed signal by one fine delay duration; and     each of the first fine delay chain and the second fine delay chain is configured to determine, based on the number of valid fine delay coded signals corresponding to the plurality of the fine delay units and the number of the charging current sources and the discharging current sources that are turned off, a third delay amount, and delay, based on the determined third delay amount, the inverted first delayed signal or the inverted second delayed signal to obtain the third delayed signal or the fourth delayed signal respectively.

15. The electronic device of claim 14, wherein the glitch elimination branch comprises an output inverter and a capacitor, one terminal of the capacitor is connected with an input terminal of the output inverter, and is connected between negative terminals of the charging current sources and positive terminals of the discharging current sources, and the other terminal of the capacitor is grounded; and     the capacitor is configured to combine the third delayed signal and the fourth delayed signal to obtain the combined signal; and the output inverter is configured to perform inverting processing on the combined signal to obtain the output signal.

16. A delay chain circuit, comprising:

a delay branch, configured to perform delay processing on an input signal to obtain a first delayed signal and a second delayed signal, wherein a difference between a delay amount of the first delayed signal and a delay amount of the second delayed signal is one coarse delay duration;

an inverting processing branch, configured to invert the first delayed signal and delay the inverted first delayed signal for a plurality of fine delay durations to obtain a third delayed signal, and invert the second delayed signal and delay the inverted second delayed signal for the plurality of fine delay durations to obtain a fourth delayed signal;

a glitch elimination branch, configured to combine the third delayed signal and the fourth delayed signal to obtain a combined signal, and perform inverting processing on the combined signal to obtain an output signal;

wherein a delay amount of the output signal is between a delay amount of the third delayed signal and a delay amount of the fourth delayed signal;

wherein the inverting processing branch comprises a first fine delay chain and a second fine delay chain;

the first fine delay chain is configured to invert the first delayed signal, and delay the inverted first delayed signal for the plurality of fine delay durations to obtain the third delayed signal; and the second fine delay chain is configured to invert the second delayed signal, and delay the inverted second delayed signal for the plurality of fine delay durations to obtain the fourth delayed signal;

wherein delay amount provided by the first fine delay chain and delay amount provided by the second fine delay chain are the same, and a maximum total sum of the plurality of fine delay durations provided by each fine delay chain is equal to one coarse delay duration.

17. The delay chain circuit of claim 16, wherein the delay branch comprises a first coarse delay chain and a second coarse delay chain connected in parallel, the first coarse delay chain is configured to delay the input signal for a first plurality of coarse delay durations to obtain the first delayed signal, and the second coarse delay chain is configured to delay the input signal for a second plurality of coarse delay durations to obtain the second delayed signal, wherein the first plurality of coarse delay durations is different from the second plurality of coarse delay durations;

wherein the first coarse delay chain comprises a plurality of first coarse delay groups sequentially connected in series, and each of the plurality of first coarse delay groups is configured to receive one first coarse delay coded signal and comprises at least two first coarse delay units;

for each of the plurality of first coarse delay groups, when the first coarse delay coded signal corresponding to the first coarse delay group is valid, each of the at least two first coarse delay units in the first coarse delay group is valid; and when the first coarse delay unit is valid, the first coarse delay unit is configured to delay the input signal for one coarse delay duration; and the first coarse delay chain is configured to determine a first delay amount for the input signal, based on the number of valid first coarse delay coded signals corresponding to the plurality of first coarse delay groups and the number of the first delay units included in each of the plurality of first coarse delay groups, and perform, based on the determined first delay amount, the delay processing on the input signal to obtain the first delayed signal.

18. The delay chain circuit of claim 17, wherein the second coarse delay chain comprises one forced delay unit and a plurality of second coarse delay groups, the forced delay unit is connected in series with the plurality of second coarse delay groups, and the plurality of second coarse delay groups are sequentially connected in series; each of the plurality of second coarse delay groups is configured to receive one second coarse delay coded signal and comprises at least two second coarse delay units;

for each of the plurality of second coarse delay groups, when the second coarse delay coded signal corresponding to the second coarse delay group is valid, each of the at least two second coarse delay units in the second coarse delay group is valid; and when the second coarse delay unit is valid, the second coarse delay unit is configured to delay the input signal for one coarse delay duration;

the forced delay unit is configured to delay the input signal for one coarse delay duration; and the second coarse delay chain is configured to determine a second delay amount for the input signal, based on the number of valid second coarse delay coded signals corresponding to the plurality of the second coarse delay groups, the number of the second coarse delay units included in each of the plurality of second coarse delay groups, and the forced delay unit, and delay the input signal based on the determined second delay amount, to obtain the second delayed signal.

19. The delay chain circuit of claim 16, wherein each of the first fine delay chain and the second fine delay chain comprises:

a first switch, configured to connect the glitch elimination branch with a high level when the first delayed signal or the second delayed signal is low; and a second switch, configured to ground the glitch elimination branch when the first delayed signal or the second delayed signal is high;

wherein the first switch and the second switch are both electronic switches, control terminals of the first switch and the second switch are both configured to receive the first delayed signal or the second delayed signal, an input terminal of the first switch is configured to be connected with the high level, an output terminal of the first switch is connected with an input terminal of the second switch, an output terminal of the second switch is grounded, and the glitch elimination branch is connected between the first switch and the second switch.

20. The delay chain circuit of claim 19, wherein each of the first fine delay chain and the second fine delay chain comprises a plurality of fine delay units connected in parallel, each of the plurality of fine delay units comprises one charging current source and one discharging current source connected in series;

each of the plurality of fine delay units is configured to receive one fine delay coded signal, and when the fine delay coded signal is valid, the charging current source and the discharging current source of the corresponding fine delay unit are turned off, and the corresponding fine delay unit is configured to increase the delay amount of the inverted first delayed signal or the inverted second delayed signal by one fine delay duration; when the fine delay coded signal is invalid, the charging current source and the discharging current source of the corresponding fine delay unit are turned on, and the corresponding fine delay unit is configured to decrease the delay amount of the inverted first delayed signal or the inverted second delayed signal by one fine delay duration; and each of the first fine delay chain and the second fine delay chain is configured to determine a third delay amount, based on the number of valid fine delay coded signals corresponding to the plurality of the fine delay units and the number of the charging current sources and the discharging current sources that are turned off, and delay, based on the determined third delay amount, the inverted first delayed signal or the inverted second delayed signal to obtain the third delayed signal or the fourth delayed signal respectively.

* * * * *